(12) United States Patent
Liu

(10) Patent No.: US 11,107,413 B2
(45) Date of Patent: Aug. 31, 2021

(54) DISPLAY SUBSTRATE AND METHOD FOR MANUFACTURING THE SAME, DISPLAY DEVICE

(71) Applicant: BOE Technology Group Co., Ltd., Beijing (CN)

(72) Inventor: Libin Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/016,668

(22) Filed: Sep. 10, 2020

(65) Prior Publication Data

US 2021/0193043 A1   Jun. 24, 2021

(30) Foreign Application Priority Data

Dec. 20, 2019 (CN) .......................... 201922312744.8

(51) Int. Cl.
*G09G 3/32* (2016.01)
*G09G 3/30* (2006.01)
*G09G 3/3258* (2016.01)
*G09G 3/3275* (2016.01)
*H01L 27/32* (2006.01)

(52) U.S. Cl.
CPC ......... *G09G 3/3258* (2013.01); *G09G 3/3275* (2013.01); *H01L 27/3265* (2013.01); *H01L 27/3272* (2013.01); *H01L 27/3276* (2013.01); *G09G 2300/0426* (2013.01); *H01L 2227/323* (2013.01)

(58) Field of Classification Search
CPC .. G09G 3/30; G09G 3/32; G09G 3/34; G09G 3/36; G09G 5/00; G06F 3/038; H01L 27/3265; H01L 27/3272; H01L 27/3276; H01L 2227/323
See application file for complete search history.

(56) References Cited

U.S. PATENT DOCUMENTS

| 2015/0130691 A1* | 5/2015 | Jeon ..................... G09G 3/3225 345/82 |
| 2018/0069069 A1* | 3/2018 | Ebisuno .............. H01L 27/3276 |
| 2019/0147799 A1* | 5/2019 | Kim ..................... G09G 3/3233 345/55 |
| 2019/0148476 A1* | 5/2019 | Park ..................... G09G 3/3291 257/40 |
| 2020/0013337 A1* | 1/2020 | Cho ..................... G09G 3/3233 |

* cited by examiner

*Primary Examiner* — Pegeman Karimi
(74) *Attorney, Agent, or Firm* — Nath, Goldberg & Meyer; Joshua B. Goldberg

(57) ABSTRACT

The present disclosure provides a display substrate and a method for manufacturing the same, and a display device. In the display substrate, the pixel circuit includes a second capacitor, a first electrode of the second capacitor is formed by a connection portion of active layers of a second compensation transistor and a first compensation transistor, a second electrode of the second capacitor is located on a side, facing a base, of the active layer of the first compensation transistor, and the second electrode of the second capacitor is electrically coupled to the power line adjacent thereto through a via hole. The second capacitor with a relative large capacitance is provided to stabilize a voltage at a location where the first compensation transistor and the second compensation transistor are coupled during a light emitting stage.

13 Claims, 4 Drawing Sheets

DISPLAY SUBSTRATE AND METHOD FOR MANUFACTURING THE SAME, DISPLAY DEVICE

CROSS REFERENCE TO RELATED APPLICATIONS

The present application claims priority to Chinese patent application No. 201922312744.8 filed by the Chinese intellectual property office on Dec. 20, 2019, the entire contents of which are incorporated herein by reference.

TECHNICAL FIELD

The present disclosure relates to the field of display technology, and more particularly, to a display substrate and a method for manufacturing the same, and a display device.

BACKGROUND

A light emitting diode display device is, for example, an Organic Light Emitting Diode (OLED) display device. A row period of the organic light emitting diode display device generally includes a data writing stage and a light emitting stage. In the data writing stage, a data voltage is written to a corresponding pixel circuit, and in the light emitting stage, light is emitted in accordance with the data voltage. How to improve the stability of the data voltage in the light emitting stage becomes a technical problem to be solved.

SUMMARY

According to a first aspect of the present disclosure, a display substrate is provided, and the display substrate includes a base, and a plurality of pixel circuits arranged in rows and columns on the base, a plurality of gate lines extending in a row direction, a plurality of power lines extending in a column direction and a plurality of data lines extending in the column direction, one of the data lines and one of the power lines are arranged between any adjacent two columns of pixel circuits, and one of the gate lines is arranged between any adjacent two rows of pixel circuits, each row of pixel circuits are electrically coupled to one of the gate lines, and each column of pixel circuits are electrically coupled to at least one of two power lines at both sides thereof along the row direction, each of the pixel circuits includes a first switching transistor, a driving transistor, a first compensation transistor, a second compensation transistor, and a light emitting device, a gate electrode of the first switching transistor is electrically coupled to the gate line corresponding thereto, a first electrode of the first switching transistor is electrically coupled to the data line corresponding thereto, a second electrode of the first switching transistor is electrically coupled to a first electrode of the driving transistor; a second electrode of the driving transistor is electrically coupled to a first electrode of the second compensation transistor, a portion of an active layer between a gate electrode of the second compensation transistor and a gate electrode of the first compensation transistor is made conductive, the gate electrode of the second compensation transistor and the gate electrode of the first compensation transistor are arranged in a same layer as and integrated with the gate line corresponding thereto, a second electrode of the first compensation transistor is electrically coupled to a gate electrode of the driving transistor, the first electrode of the driving transistor is electrically coupled to the power line, the second electrode of the driving transistor is electrically coupled to the light emitting device, and active layers of the first compensation transistor and the second compensation transistor are respectively located on a side of the gate electrodes of the first compensation transistor and the second compensation transistor facing the base; each of the pixel circuits further includes a second capacitor, a first electrode of the second capacitor is formed by the conductive portion of the active layer between the second compensation transistor and the first compensation transistor, a second electrode of the second capacitor is located on a side, facing the base, of the active layer of the first compensation transistor, and the second electrode of the second capacitor is electrically coupled to the power line adjacent thereto through a via hole.

In some implementations, the second electrode of the second capacitor includes at least one of molybdenum, titanium, and alloys thereof, and the first electrode of the second capacitor is a polysilicon layer.

In some implementations, the display substrate further includes a plurality of reset control lines extending in the row direction, a plurality of reset signal lines extending in the row direction, each row of pixel circuits correspond to one of the reset control lines and one of the reset signal lines, each of the pixel circuits further includes a reset transistor, a gate electrode of the reset transistor is electrically coupled to the reset control line corresponding thereto, a first electrode of the reset transistor is electrically coupled to the reset signal line corresponding thereto, and a second electrode of the reset transistor is electrically coupled to the gate electrode of the driving transistor.

In some implementations, the reset control lines are disposed in a same layer as the gate lines, the reset signal lines are disposed on a side of the gate lines away from the base, and the power lines are disposed on a side of the reset signal lines away from the base.

In some implementations, the data lines and the power lines are disposed in a same layer.

In some implementations, each of the pixel circuits further includes a first capacitor, a first electrode of the first capacitor is disposed in a same layer as and integrated with the gate electrode of the driving transistor, a second electrode of the first capacitor is disposed in a same layer as the reset signal lines, and the second electrode of the first capacitor is electrically coupled to the power line.

In some implementations, second electrodes of first capacitors in the pixel circuits of a same row are coupled together.

In some implementations, the display substrate further includes a plurality of light emitting control lines extending in the row direction, each row of pixel circuits corresponds to one of the light emitting control lines, each of the pixel circuit further include a first light emitting control transistor and a second light emitting control transistor, gate electrodes of the first light emitting control transistor and the second light emitting control transistor are disposed in a same layer as and integrated with the light emitting control line corresponding thereto, and a portion of the active layer between the gate electrodes of the first light emitting control transistor and the second light emitting control transistor is made conductive; a portion of the active layer between the gate electrodes of the second light emitting control transistor and the driving transistor corresponding thereto is made conductive, a second electrode of the second light emitting control transistor is electrically coupled to the light emitting device.

In some implementations, the light emitting device is an organic light emitting diode.

In some implementations, the display substrate further includes a second switching transistor, a gate electrode of the second switching transistor and the reset control line corresponding thereto are disposed in a same layer and integrated with each other, a portion of the active layer between the gate electrodes of the second switching transistor and the reset transistor is made conductive, and a second electrode of the second switching transistor and the second electrode of the second light emitting control transistor corresponding thereto are disposed in a same layer and electrically coupled to the light emitting device through a via hole respectively.

According to a second aspect of the present disclosure, there is provided a display device, which includes the display substrate according to the first aspect.

According to a third aspect of the present disclosure, there is provided a method for manufacturing the display panel according to the first aspect, and the method includes:

providing a base;

forming a light blocking layer on a side of the base by using a conductive material;

forming a pixel circuit on a side of the light blocking layer, wherein the forming the pixel circuit includes:

making a portion of an active layer between gate electrodes of both the second compensation transistor and the first compensation transistor in the pixel circuit conductive, and forming a second capacitor, wherein a first electrode of the second capacitor is formed by the conductive portion of the active layer between the second compensation transistor and the first compensation transistor, and a second electrode of the second capacitor is formed by the light blocking layer.

In some implementations, the conductive material forming the light blocking layer includes at least one of molybdenum, titanium, and alloys thereof, and a material for forming the first electrode of the second capacitor includes polysilicon.

Reference signs: C1, first capacitor; C2, second capacitor; T4, first switching transistor; T3, driving transistor; T21, first compensation transistor; T22, second compensation transistor; T1, reset transistor; T5, first light emitting control transistor; T6, second light emitting control transistor; T7, second switching transistor; Gate, gate line; Reset, reset control line; Data, data line; VDD, power line; Vint, reset signal line; Em, light emitting control line; H, via hole; 1, base; 2, second electrode of the second capacitor; 3, first insulating layer; 4, active layer; 5, second insulating layer; 6, third insulating layer; 7, fourth insulating layer; 8, layer where the power line VDD is located; 9, fifth insulating layer.

DESCRIPTION OF EMBODIMENTS

In order to make a person skilled in the art better understand the technical solutions of the present disclosure, the present disclosure is further described in detail below with reference to the accompanying drawings and the embodiments.

In the present disclosure, two structures being provided in a same layer means that they are formed of a same material layer, and thus they are in a same layer in a stacking relationship, but do not represent that they are equidistant from a base, nor that structures between them and the base are completely the same.

Referring to FIGS. 1 to 4, an embodiment of the present disclosure provides a display substrate including: a base 1, a plurality of pixel circuits arranged in rows and columns on the base 1, a plurality of gate lines Gate extending in a row direction, a plurality of power lines VDD extending in a column direction, and a plurality of data lines Data extending in the column direction, where one data line Data and one power line VDD are arranged between any adjacent columns of pixel circuits, one gate line Gate is arranged between any adjacent rows of pixel circuits, the rows of pixel circuits are correspondingly and electrically coupled to the gate lines Gate in one-to-one correspondence, the columns of pixel circuits are correspondingly and electrically coupled to the data lines Data in one-to-one correspondence, and each column of pixel circuits are at least electrically coupled to one power line VDD of two power lines VDD at both sides thereof in the row direction.

Figure 2:
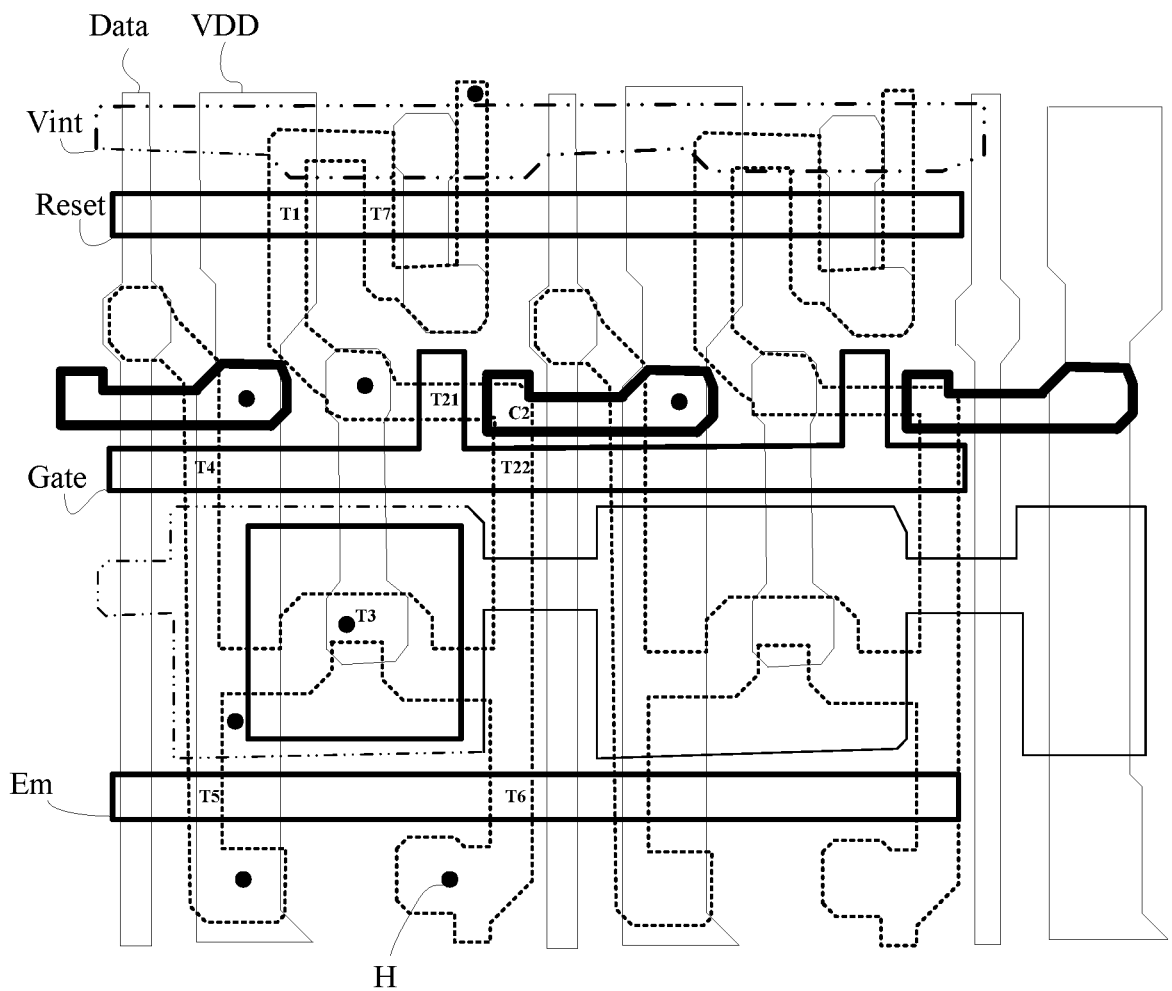
FIG. 2 is a layout of the pixel circuit shown in FIG. 1.

The same layer structures are depicted with the same lines in FIG. 2. The stacking relationship of the structures is only exemplarily shown in FIG. 4.

The row and column directions in the present disclosure are only meant to be two intersecting directions, and are not limited to perpendicular intersections, nor are they dependent on how the display substrate is placed with respect to the viewer.

Since the power lines VDD are usually equipotential, the pixel circuit can be electrically coupled to any one of the two power lines VDD at both sides thereof along the row direction according to the actual layout design.

Referring to FIG. 2, the pixel circuit is electrically coupled to two power lines VDD at both sides thereof in the row direction.

The pixel circuit includes a first switching transistor T4, a driving transistor T3, a first compensation transistor T21, and a second compensation transistor T22. A gate electrode of the first switching transistor T4 is electrically coupled to a corresponding gate line Gate, a first electrode of the first switching transistor T4 is electrically coupled to a corresponding data line Data, and a second electrode of the first switching transistor T4 is electrically coupled to a first electrode of the driving transistor T3; a second electrode of the driving transistor T3 is electrically coupled to a first electrode of the second compensation transistor T22, active layers 4 of the second compensation transistor T22 and the first compensation transistor T21 are disposed in a same layer and integrated with each other, a portion of the active layer 4 between the gate electrodes of the second compensation transistor T22 and the first compensation transistor T21 is made conductive (where being made conductive means being performed ion doping thereon to enhance its conductivity), the gate electrodes of the second compensation transistor T22 and the first compensation transistor T21 are disposed in a same layer as and integrated with a corresponding gate line Gate, the second electrode of the first compensation transistor T21 is electrically coupled to a gate electrode of the driving transistor T3, the first electrode of the driving transistor T3 is coupled to the power line VDD, the second electrode of the driving transistor T3 is electrically coupled to a light emitting device, and the active layers of the first compensation transistor T21 and the second compensation transistor T22 are disposed on a side of the gate electrodes thereof facing the base 1.

Figure 1:
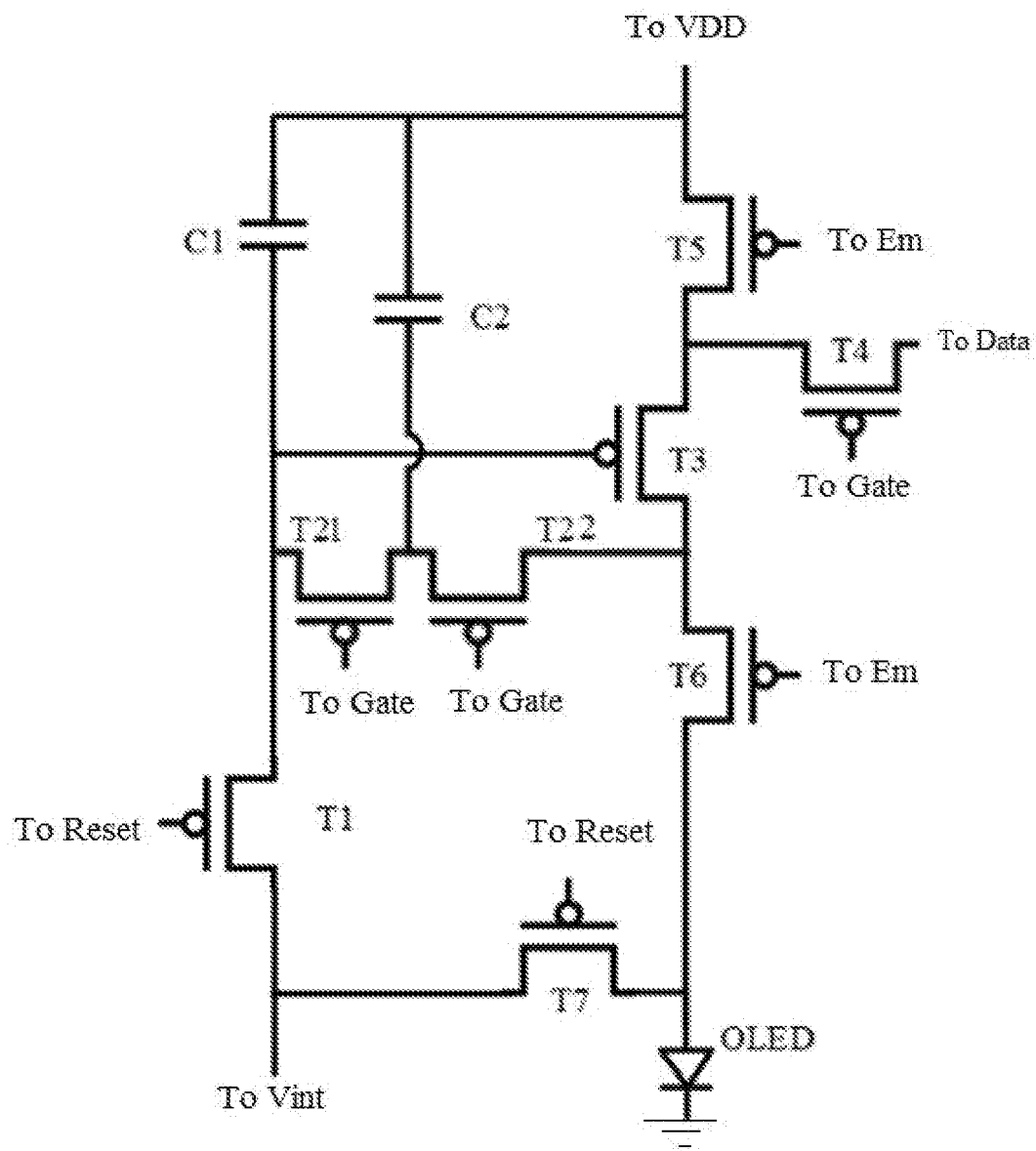
FIG. 1 is a circuit diagram of a pixel circuit in a display substrate according to an embodiment of the present disclosure.

The first electrode of the driving transistor T3 may be directly electrically coupled to the power line VDD, for example, and certainly, referring to FIG. 1, in a case where it is necessary to control whether the light emitting device emits light or not, the first electrode of the driving transistor T3 is indirectly electrically coupled to the power line VDD through a first light emitting control transistor T5.

When the first and second compensation transistors T21 and T22 are turned off (when the gate line Gate to which the first and second compensation transistors T21 and T22 are electrically coupled provides an inactive voltage), the first and second compensation transistors T21 and T22 are equivalent to two large resistors coupled in series, so that it is possible to suppress leakage of electric charges stored by the gate electrode of the driving transistor T3 in the light emitting stage, the voltage at the gate electrode of the driving transistor T3 is kept stable, and resulting in keep the stable light emitting luminance stable.

The first and second compensation transistors T21 and T22 in the present disclosure are top gate type thin film transistors. Certainly, in consideration of process simplicity, in this case, each of the remaining transistors is also a top gate type thin film transistor.

Figure 3:
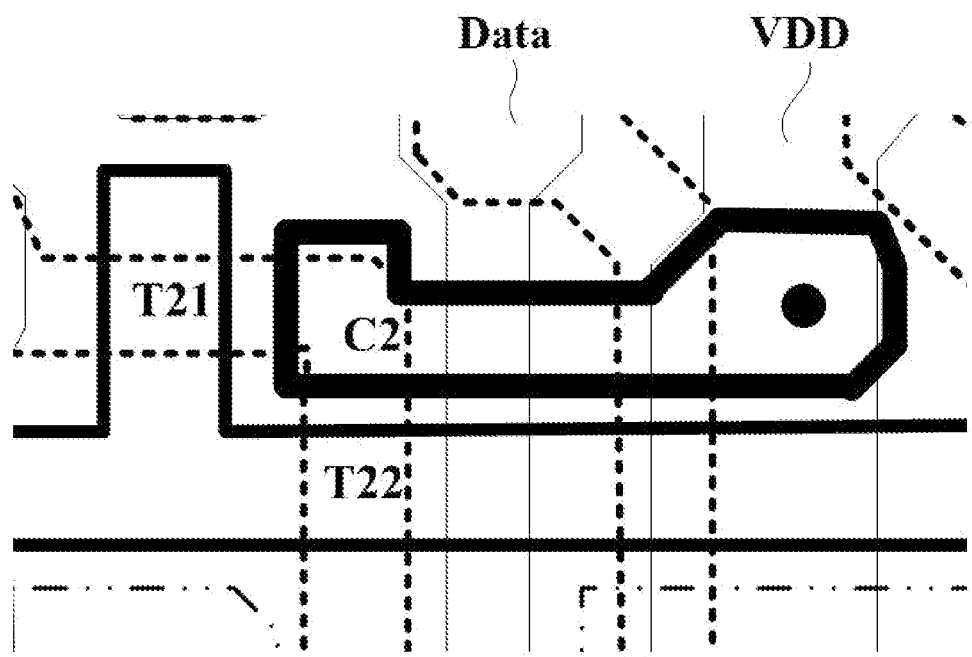
FIG. 3 is a partial enlarged view of the layout shown in FIG. 2.
Figure 4:
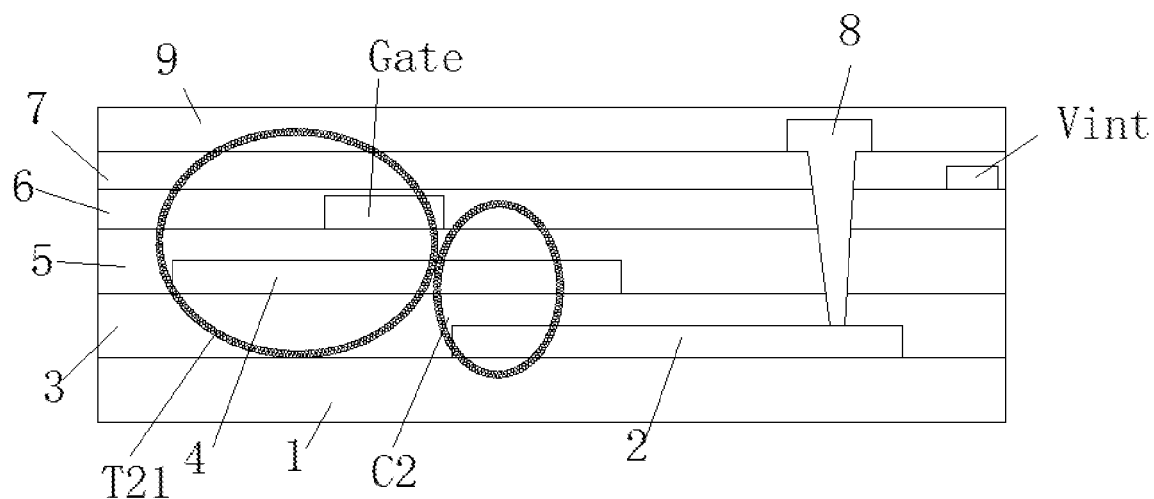
FIG. 4 is a schematic diagram of a stacking relationship of layers in the display substrate shown in FIG. 1.

Referring to FIGS. 2, 3 and 4, the pixel circuit further includes a second capacitor C2, a first electrode of the second capacitor C2 is formed by a connection portion of the active layers of the second compensation transistor T22 and the first compensation transistor T21, a second electrode 2 of the second capacitor C2 is located on a side of the active layer 4 of the first compensation transistor T21 facing the base 1, and the second electrode 2 of the second capacitor C2 is electrically coupled to one of the power lines VDD adjacent thereto through a via hole H.

That is, a layer of conductive structure is further disposed between the active layer 4 and the base 1 as the second electrode 2 of the second capacitor C2, and the layer of conductive structure overlaps with a region where the active layers 4 of both the first compensation transistor T21 and the second compensation transistor T22 are coupled to form the second capacitor C2. Since the first electrode and the second electrode of the second capacitor C2 are separated by only a first insulating layer 3, and a distance between the first electrode and the second electrode of the second capacitor C2 is relative small, a capacitance of the second capacitor C2 is relative large, so that the stability of the voltage at the gate electrode of the driving transistor T3 in the light emitting stage can be better maintained.

In some implementations, referring to FIGS. 1 and 2, the display substrate further includes a plurality of reset control lines Reset extending in the row direction, a plurality of reset signal lines Vint extending in the row direction, each row of pixel circuits correspond to one reset control line Reset and one Reset signal line Vint, the pixel circuit further includes a reset transistor T1, a gate electrode of the reset transistor T1 is electrically coupled to the corresponding reset control line Reset, a first electrode of the reset transistor T1 is electrically coupled to the corresponding reset signal line Vint, and a second electrode of the reset transistor T1 is electrically coupled to the gate electrode of the driving transistor T3.

Specifically, referring to FIG. 2, a section of the reset control line Reset is used as the gate electrode of the reset transistor T1. The second electrode of the reset transistor T1 is electrically coupled to the gate electrode of the driving transistor T3 through the via hole H, and the second electrode of the reset transistor T1 is integrated with the second electrode of the first compensation transistor T21.

Certainly, in some other implementations, the reset control line Reset, the reset signal line Vint and the reset transistor T1 may not be provided.

In some implementations, the reset control line Reset is disposed in a same layer as the gate line Gate, the reset signal line Vint is disposed on a side of the gate line Gate away from the base 1, and the power line VDD is disposed on a side of the reset signal line Vint away from the base 1.

Referring to FIGS. 2 and 4, along a direction away from the base 1, the second electrode 2 of the second capacitor C2, the first insulating layer 3, the active layer 4, the second insulating layer 5, a layer where the gate electrode and the gate line Gate are located, a third insulating layer 6, a layer where the reset signal line Vint is located, a fourth insulating layer 7, a layer 8 where the power line VDD is located, and a fifth insulating layer 9 are sequentially disposed.

In some implementations, the data lines Data and the power lines VDD are disposed in a same layer, which can reduce the number of layer structures.

In some implementations, the pixel circuit further includes a first capacitor C1, a first electrode of the first capacitor C1 is disposed in the same layer as and coupled to the gate electrode of the driving transistor T3, a second electrode of the first capacitor C1 is disposed in the same layer as the reset signal line Vint, and the second electrode of the first capacitor C1 is electrically coupled to the power line VDD.

Referring to FIG. 2, the second electrode of the driving transistor T3 is disposed in a same layer as the reset signal line Vint, and certainly, they are separated from each other. The gate electrode of the driving transistor T3 is made to be relative large and overlaps the second electrode of the driving transistor T3 to form the first capacitor C1. Note that the gate electrode of the driving transistor T3 overlapping the second electrode of the driving transistor T3 means that an orthographic projection of the gate electrode of the driving transistor T3 on the base overlaps an orthographic projection of the second electrode of the driving transistor T3 on the base.

Specifically, second electrodes of first capacitors C1 of pixel circuits in a single row are coupled together.

Certainly, the layer structures where both electrodes of the first capacitor C1 are located are not limited thereto. For example, it is possible to arrange the second electrode of the first capacitor C1 in a same layer as the second electrode 2 of the second capacitor C2 and to couple them to each other.

In some implementations, the second electrode 2 of the second capacitor C2 is a LS layer and the first electrode of the second capacitor C2 is a p-si layer.

In some implementations, referring to FIGS. 1, 2 and 4, the display substrate further includes a plurality of light emitting control lines Em extending in the row direction, each row of pixel circuits correspond to one light emitting control line Em, the pixel circuit further includes a first light emitting control transistor T5 and a second light emitting control transistor T6, a gate electrode of the first light emitting control transistor T5 and a gate electrode of the second light emitting control transistor T6 are disposed in the same layer as and integrated with a corresponding light emitting control line Em, a first electrode of the first light emitting control transistor T5 is electrically coupled to one of the power lines VDD adjacent thereto, and a portion of an active layer 4 between the gate electrodes of the first light emitting control transistor T5 and the corresponding drive transistor T3 is made conductive; a portion of the active layer 4 between the gate electrodes of the second light emitting controlling transistor T6 and the corresponding driving transistor T3 is made conductive, and a second electrode of the second light emitting control transistor T6 is electrically coupled to a light emitting device.

In some implementations, the display substrate further includes a light emitting device, which is an organic light emitting diode.

For example, the second electrode of the second light emitting control transistor T6 is electrically coupled to one electrode (generally referred to as a pixel electrode, not shown in the drawings) of the organic light emitting diode through a via hole H passing through the third insulating layer 6, the fourth insulating layer 7, and the fifth insulating layer 9.

Certainly, in some implementations, the second light emitting control transistor T6 is not provided in the pixel circuit. In this case, the second electrode of the driving transistor T3 is directly electrically coupled to one electrode of the light emitting device.

In some implementations, referring to FIGS. 1, 2 and 4, the display substrate further includes a second switching transistor T7, a gate electrode of the second switching transistor T7 is disposed in a same layer as and integrated with a corresponding reset control line Reset, a portion of the active layer 4 between the gate electrodes of the second switching transistor T7 and the reset transistor T1 is made conductive, and the second switching transistor T7 is disposed in a same layer as the second electrode of a corresponding second light emitting control transistor T6, and they are electrically coupled to the light emitting device, for example, to a pixel electrode of the light emitting device through the via holes H, respectively.

As such, a first electrode of the second switching transistor T7 is electrically coupled to the first electrode of the reset transistor T1, and a second electrode of the second switching transistor T7 is electrically coupled to the first electrode of the second light emitting control transistor T6.

An embodiment of the present disclosure further provides a display device, including the above display substrate.

The display device is any product or component having a display function, such as an organic light emitting diode display panel, a mobile phone, and a computer.

Figure 5:
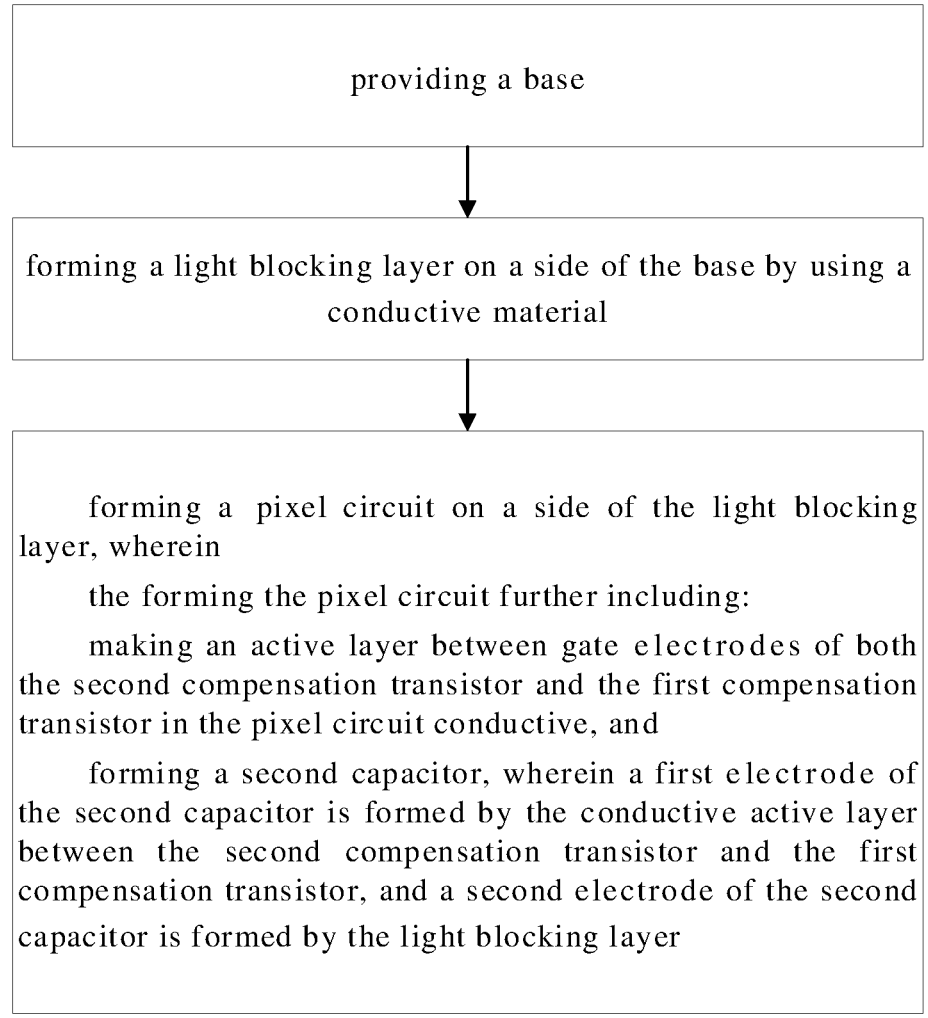
FIG. 5 is a flowchart of a method for manufacturing a display substrate according to an embodiment of the present disclosure.

FIG. 5 is a flowchart of a method for manufacturing a display substrate according to an embodiment of the present disclosure. Referring to FIG. 5, the method for manufacturing the display substrate in the foregoing embodiment includes:

providing a base;

forming a light blocking layer on a side of the base by using a conductive material;

forming a pixel circuit on a side of the light blocking layer, wherein the step of forming the pixel circuit further includes: making a portion of an active layer between gate electrodes of both the second compensation transistor and the first compensation transistor in the pixel circuit conductive; and forming a second capacitor, wherein a first electrode of the second capacitor is formed by the conductive portion of the active layer between the second compensation transistor and the first compensation transistor, and a second electrode of the second capacitor is formed by the light blocking layer.

The conductive material forming the light blocking layer includes at least one of molybdenum, titanium and alloys thereof, and the material for forming the first end of the second capacitor includes poly silicon.

In this embodiment, when the first and second compensation transistors T21 and T22 are turned off (when the gate line Gate to which the first and second compensation transistors T21 and T22 they are electrically coupled provides an inactive voltage), the first and second compensation transistors T21 and T22 are equivalent to two large resistors coupled in series, so that it is possible to suppress leakage of electric charges stored at the gate electrode of the driving transistor T3 in the light emitting stage, the voltage at the gate electrode of the driving transistor T3 is kept stable, resulting in a stable light emitting luminance. Meanwhile, the first electrode and the second electrode of the second capacitor are only separated by the first insulating layer and are relatively close to each other, so that a capacitance of the second capacitor is relative large, and the stability of the voltage at the gate electrode of the driving transistor in the light emitting stage can be better maintained.

It will be understood that the above embodiments are merely exemplary embodiments adopted to illustrate the principles of the present disclosure, and the present disclosure is not limited thereto. It will be apparent to those skilled in the art that various modifications and variants can be made without departing from the spirit and scope of the present disclosure, and such modifications and variants are also considered to be within the scope of the present disclosure.

The invention claimed is:

1. A display substrate, comprising a base, a plurality of pixel circuits arranged in rows and columns on the base, a plurality of gate lines extending in a row direction, a plurality of power lines extending in a column direction and a plurality of data lines extending in the column direction, one of the data lines and one of the power lines are arranged between any adjacent two columns of pixel circuits, and one of the gate lines is arranged between any adjacent two rows of pixel circuits, each row of pixel circuits are electrically coupled to one of the gate lines, and each column of pixel circuits are electrically coupled to at least one of two power lines at both sides thereof along the row direction, each of the pixel circuits comprises a first switching transistor, a driving transistor, a first compensation transistor, a second compensation transistor, and a light emitting device, a gate electrode of the first switching transistor is electrically coupled to the gate line corresponding thereto, a first electrode of the first switching transistor is electrically coupled to the data line corresponding thereto, a second electrode of the first switching transistor is electrically coupled to a first electrode of the driving transistor; a second electrode of the driving transistor is electrically coupled to a first electrode of the second compensation transistor, a portion of an active layer between a gate electrode of the second compensation transistor and a gate electrode of the first compensation transistor is made conductive, the gate electrode of the second compensation transistor and the gate electrode of the first compensation transistor are arranged in the same layer as and integrated with the gate line corresponding thereto, a second electrode of the first compensation transistor is electrically coupled to a gate electrode of the driving transistor, the first electrode of the driving transistor is electrically coupled to the power line, the second electrode of the driving transistor is electrically coupled to the light emitting device, and active layers of the first compensation transistor and the second compensation transistor are located on a side of the gate electrodes of the first compensation transistor and the second compensation transistor facing the base;

each of the pixel circuits further comprises a second capacitor, a first electrode of the second capacitor is formed by the conductive portion of the active layer between the second compensation transistor and the first compensation transistor, a second electrode of the second capacitor is located on a side, facing the base, of the active layer of the first compensation transistor, and the second electrode of the second capacitor is electrically coupled to one of the power lines adjacent thereto through a via hole.

2. The display substrate of claim 1, wherein the second electrode of the second capacitor comprises at least one of molybdenum, titanium, and alloys thereof, and the first electrode of the second capacitor is a polysilicon layer.

3. The display substrate of claim 1, further comprising a plurality of reset control lines extending in the row direction, a plurality of reset signal lines extending in the row direction, each row of pixel circuits correspond to one of the reset control lines and one of the reset signal lines, each of the pixel circuits further comprises a reset transistor, a gate electrode of the reset transistor is electrically coupled to the reset control line corresponding thereto, a first electrode of the reset transistor is electrically coupled to the reset signal line corresponding thereto, and a second electrode of the reset transistor is electrically coupled to the gate electrode of the driving transistor.

4. The display substrate of claim 3, wherein the reset control lines are disposed in a same layer as the gate lines, the reset signal lines are disposed on a side of the gate lines away from the base, and the power lines are disposed on a side of the reset signal line away from the base.

5. The display substrate of claim 4, wherein the data lines and the power lines are disposed in a same layer.

6. The display substrate of claim 5, wherein each of the pixel circuits further comprises a first capacitor, a first electrode of the first capacitor is disposed in a same layer as and integrated with the gate electrode of the driving transistor, a second electrode of the first capacitor is disposed in a same layer as the reset signal lines, and a second electrode of the first capacitor is electrically coupled to the power line.

7. The display substrate of claim 6, wherein second electrodes of first capacitors in the pixel circuits of a same row are coupled together.

8. The display substrate of claim 7, further comprising a plurality of light emitting control lines extending in the row direction, each row of pixel circuits correspond to one light emitting control line, each of the pixel circuits further comprise a first light emitting control transistor and a second light emitting control transistor, gate electrodes of the first light emitting control transistor and the second light emitting control transistor are disposed in a same layer as and integrated with the light emitting control line corresponding thereto, and an active layer between the gate electrodes of the first light emitting control transistor and the second light emitting control transistor is made conductive; an active layer between the gate electrodes of the second light emitting control transistor and the driving transistor corresponding thereto is made conductive, a second electrode of the second light emitting control transistor is electrically coupled to the light emitting device.

9. The display substrate of claim 8, further comprising a second switching transistor, a gate electrode of the second switching transistor and the reset control line corresponding thereto are disposed in a same layer and integrated with each other, an active layer between the gate electrodes of the second switching transistor and the reset transistor is made conductive, and a second electrode of the second switching transistor and the second electrode of the second light emitting control transistor corresponding thereto are disposed in a same layer and electrically coupled to the light emitting device through a via hole respectively.

10. The display substrate of claim 9, wherein the light emitting device is an organic light emitting diode.

11. A display device, comprising the display substrate of claim 1.

12. A method for manufacturing the display substrate of claim 1, comprising:

providing a base;

forming a light blocking layer on a side of the base by using a conductive material;

forming a pixel circuit on a side of the light blocking layer, wherein the forming the pixel circuit further comprising:

making an active layer between gate electrodes of both the second compensation transistor and the first compensation transistor in the pixel circuit conductive, and forming a second capacitor, wherein a first electrode of the second capacitor is formed by the conductive portion of the active layer between the second compensation transistor and the first compensation transistor, and a second electrode of the second capacitor is formed by the light blocking layer.

13. The method of claim 12, wherein the conductive material forming the light blocking layer comprises at least one of molybdenum, titanium, and alloys thereof, and a material for forming the first electrode of the second capacitor comprises poly silicon.

* * * * *